United States Patent [19]

Le Roux

[11] Patent Number: 4,926,124
[45] Date of Patent: May 15, 1990

[54] METHOD FOR THE REMOVAL OF ARTIFACTS IN AN NMR IMAGING EXPERIMENT

[75] Inventor: Patrick Le Roux, Gif sur Yvette, France

[73] Assignee: General Electric CGR S.A., Issy les Moulineaux, France

[21] Appl. No.: 215,529

[22] Filed: Jul. 6, 1988

[30] Foreign Application Priority Data

Jul. 10, 1987 [FR] France .................. 87 09813

[51] Int. Cl.$^5$ ............................................. G01R 33/20
[52] U.S. Cl. ............................. 324/309; 128/653 A
[58] Field of Search ....................... 324/309; 128/653

[56] References Cited

U.S. PATENT DOCUMENTS

| | | | |
|---|---|---|---|
| 4,644,280 | 2/1987 | Paltiel | 324/309 |
| 4,663,591 | 5/1987 | Pelc | 324/309 |
| 4,682,108 | 7/1987 | Stetter et al. | 324/309 |
| 4,710,717 | 12/1987 | Pelc et al. | 128/653 |
| 4,724,386 | 2/1988 | Haacke et al. | 324/309 |

FOREIGN PATENT DOCUMENTS 0100183 2/1984 European Pat. Off. .
2056078 3/1981 United Kingdom .

*Primary Examiner*—Michael J. Tokar
*Attorney, Agent, or Firm*—Oblon, Spivak, McClelland, Maier & Neustadt

[57] ABSTRACT

So-called motion artifacts are removed in NMR imaging experiments by choosing a 2DFT type imaging method and by choosing a phase encoding pitch, which is a multiple of a useful encoding pitch determined by the height of the image field to be depicted. It is shown that, after the image reconstruction has been computed by Fourier transform, the central image corresponds to the depiction of the continuous components of the magnetic moments of the particles located in an examined cross-section of a body under examination, and that these continuous components are not affected by all the variations in the rate of a cyclical phenomenon which disturbs the images (in general the cardiac cycle).

5 Claims, 4 Drawing Sheets

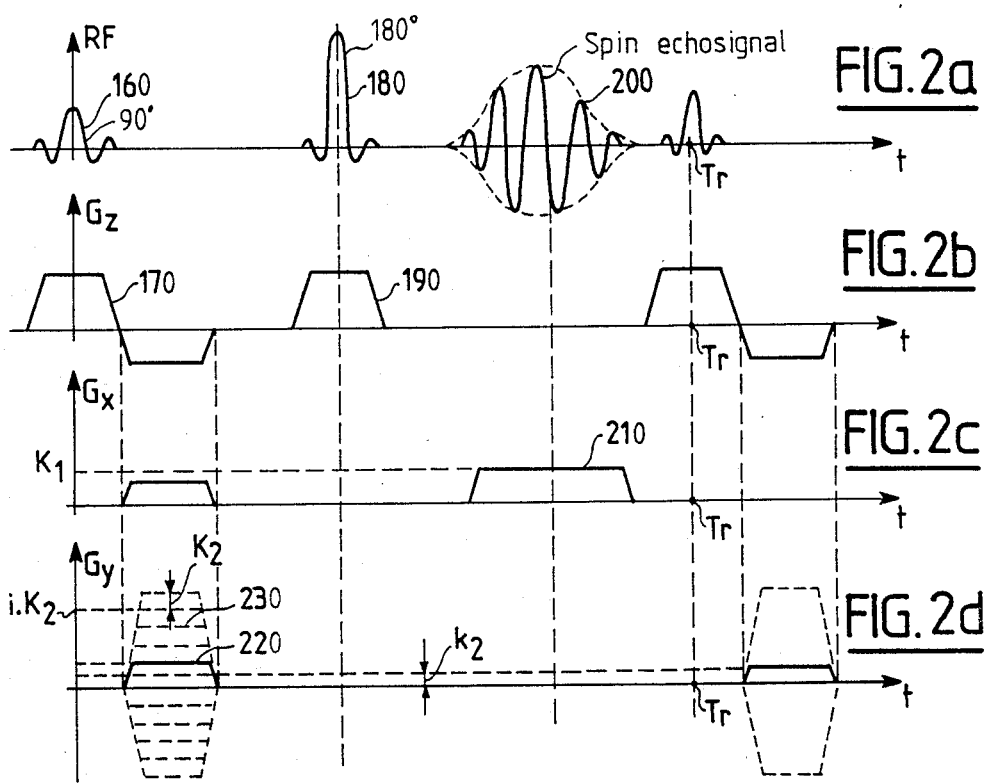
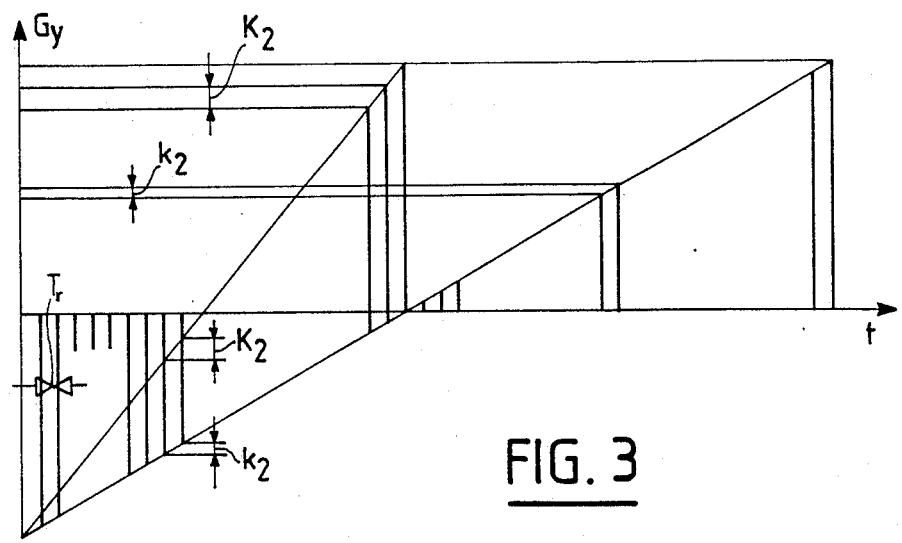

METHOD FOR THE REMOVAL OF ARTIFACTS IN AN NMR IMAGING EXPERIMENT

BACKGROUND OF THE INVENTION

1. Field of the Invention

An object of the present invention is a method to remove artifacts in a nuclear magnetic resonance (NMR) imaging experiment. This method can be applied more particularly in medicine where it is sought to represent images of cross-sections of human bodies under examination. In these images, the method can be used primarily to remove disturbances resulting from so-called moving artifacts caused by movements of bodies or in the body.

2. Description of the Prior Art

In conventional practice, the representation of moving objects involves the taking of successive shots (the term "shot" being clearly used in a broad sense) uniformly spread out in time during the movement to be studied. By displaying these shots at a low rate, the movement of the object can be closely studied. By means of cameras, modern methods of television enable the application of this technique on condition that the cameras are sufficiently fast to acquire images which are very close to each other in time, and also on condition that these images are subsequently displayed by slowing down the projection rate. Unfortunately, these general techniques are not readily applicable to methods of imaging by nuclear magnetic resonance (NMR).

In fact, the acquisition of tomographic images with instrucments of this type is obtained only after a processing operation involving the reconstruction of the cross-section images. For example, the body particles located in the cross-section of a patient's body to be studies are subjected to an excitation sequence during experimentation and restitute, at the output, a signal containing an item of information which represents their nature. Unfortunately, all the particles of the cross-section re-emit a signal at the same time. With the known methods of image reconstruction, especially the so-called 2DFT method of reconstruction, the difficulty of this simultaneous response is circumvented by repeating the experiments a certain number of times and by changing the conditions of acquisition of the signal from one experiment to another, in the course of excitation-measurement conditions. Typically in NMR imaging, 256 successive experiments are performed over a total period with a minimum duration which is close to about of half a minute. Now the cycles of fluctuation of the human body, for example, in the region of the heart, are much faster. Consequently, the sequences are all acquired during a period which is longer than that of the cardiac pulse, for example. The images are fuzzy in the immediate region of the heart.

In order to overcome this disadvantage of motion, an initial solution consisted in the carrying out synchronizations. However, in NMR, the fastest methods of excitation known as steady-state free precession (SSFP), corresponding to free precession in a state of balance of magnetic moments of the particles, must be applied to a natural frequency. This natural frequency depends on the spin-spin relaxation time (designated as $T_2$) of the magnetic moments of the particles to be studied. Of course, this natural frequency counters synchronization. There is in fact no reason why this natural frequency should be a multiple of the heart rate. If synchronization is adopted (and consequently if the idea of the SSFP mode is abandoned) and if, in addition, it is desired to produce an image which is said to be in $T_2$ (in order to show the spin-spin relaxation time), it is then necessary to wait between each experiment for a period of time equal to three or four times the interval $T_1$ (spin-lattice relaxation time) which is characteristic of the particles under study. In other words, the duration of each experiment is of the order of two seconds. The acquisition of 256 sequences then leads to a period of about 10 minutes for a single sychronized image during the cardiac cycle, taking into account the losses of time during synchronizations. However, physicians require about 32 images for a complete cardiac cycle in order to be able to gain a clear understanding of functioning of the heart. This results in a total examination time of five hours. A period of this length, however, is quite intolerable for patients. Furthermore, even assuming that patients could tolerate such a long period of examination, the cardiac cycle is not constant. The result is that synchronization of the other instants of the cycle with respect to a precise time of the cycle does not always correspond to the same state of the heart. A phase lead or phase lag with respect to a predetermined state of the heart depends on the acceleration or slowing-down of the heart rate with respect to a nominal estimated heart rate. As a result, the images exhibit artifacts.

In an alternative mode of excitation known as fast $T_2$ with limited flip-over and with synchronization, it is possible to achieve a much higher speed since typically a fast $T_2$ cycle lasts approximately 50 ms. Consequently, a second phase of the cardiac cycle can be acquired over a period substantially equal to twice this cycle. In imaging with normal resolution (256 sequences per cycle phase), this results in a total experiment time of 4 minutes. However, fast $T_2$ imaging cannot be carried out simultaneously in a single slice since the NMR signal is excessivelly attenuated and there is a loss of contrast. Accordingly, a multislice technique is employed: during idle periods, measurements are made in other slices so as to let the signal revive. In practice, the experiment then lasts four times as long, namely 40 minutes, which is also quite excessive. Furthermore, there again arises the same problem of synchronization as that mentioned above. When the heart rate is not constant (over a period of 40 minutes!), the images also exhibit artifacts.

Another technique has been conceived by Michael L. Wood and R. Marc Henkelman (of the ONTARIO CANCER INSTITUTE AND DEPARTMENT OF MEDICAL BIOPHYSICS, UNIVERSITY OF TORONTO, TORONTO, CANADA). This technique has been published in Medical Physics, Volume 13, No. 6 of November/December, 1986. It essentially consists in determining an average value over a number of successive images in order to eliminate motion artifacts. However, this imaging technique, which is concerned with elimination of the effects of motion, is not wholly effective and certain unwanted elements remain in the image. The reason of the presence of these artifact is here also bound to the variation of the cardiac cycle during these experiments.

In the invention, these drawbacks are removed by using the advantages of a special method for image reconstruction, namely, the so-called 2DFT method. In this 2DFT method, at each sequence, an excitation is followed below the measurement of the NMR resulting signal, by a period during which a magnetic field gradient with a phase encoding function of the NMR signal is applied to the part of the body under examination. The value of this gradient develops as and when the sequences needed for the reconstruction according to this method are conducted. It can be shown that the choice of the pitch of the gradient is totally related to the dimension of the volume studied, measured along the direction of the axis on which this encoding gradient is applied. The effect of this phase encoding gradient is to cause a phase shift, in the received signal, of the contributions to the total NMR signal of the different parts of the body, as a function of their abscissae measured in the volume under examination along this axis of the encoding gradient. In practice, the significant resolution of the image obtained depends on the number of sequences undertaken, during which the phase encoding gradient varies step by step.

In the invention, it is decided to use a pitch of the variation of the phase encosing gradient which is a sub-multiple one of the normal one. That is, of the one which is totally related to the dimension of a useful studied volume. In a preferred example, which example is solely in order to give a clear picture, the variation pitch of the phase encoding gradient is eight times smaller than the normal pitch. The result of this is that each described image has, along the direction of this phase encoding gradient, a dimension which is eight times greater than the conventional image field. In other words, instead of examining what happens along a height, of 30 centimeters for example, along this phase encoding axis, a search is made to find out what happens on a height which is a multiple of 240 cm, where, finally, there is nothing. To obtain an image with the same resolution in the 30 useful centimeters, it then becomes necessary to describe this image, which is eight times higher, by eight times more sequences. In a practical example, this might result in a resolution of 256 lines in the useful image: it then becomes necessary to perform 8 to 256=2048 successive sequences.

It is then shown that, by Fourier processing, it is possible to reconstruct an image representing what is not stationary in the body under examination. This result is then obtained regardless of the development of the duration of the cycle of that part which may be cyclically in motion (the heart) in the examined body. The result of this is that the images of the stationary parts are now no longer dependent on the variation of the heart cycle. It shall be shown that, in practice, to obtain this image of stationary parts, it is necessary to reconstitute the significant image only partially (for example, for a Fourier transform with 256 times 8 points to obtain an image reduced to 256 useful lines).

SUMMARY OF THE INVENTION

The invention therefore concerns a method for the removal of artifacts in an NMR imaging experiment wherein a 2DFT type imaging method is applied, with a phase encoding pitch, said pitch being predetermined by an image of a given dimension to be obtained, and with a number of sequences which is predetermined by an expected significant resolution, wherein the phase encoding pitch is modified by taking a sub-multiple of it, and wherein the number of sequences is multiplied correspondingly to correspond to an image of the same resolution but with a multiple dimension along a direction corresponding to this phase encoding.

BRIEF DESCRIPTION OF THE DRAWINGS

The invention will be better understood from the following description and the accompanying figures. These figures are given purely by way of indication and in no way restrict the scope of the invention. Of these figures:

FIGS. 2a to 2d give a schematic view of the main stages of an imaging method of the 2DFT type;

FIG. 3 gives a schematic view of the modification resulting from the invention in the concerned imaging method;

DESCRIPTION OF THE PREFERRED EMBODIMENT

Figure 1:
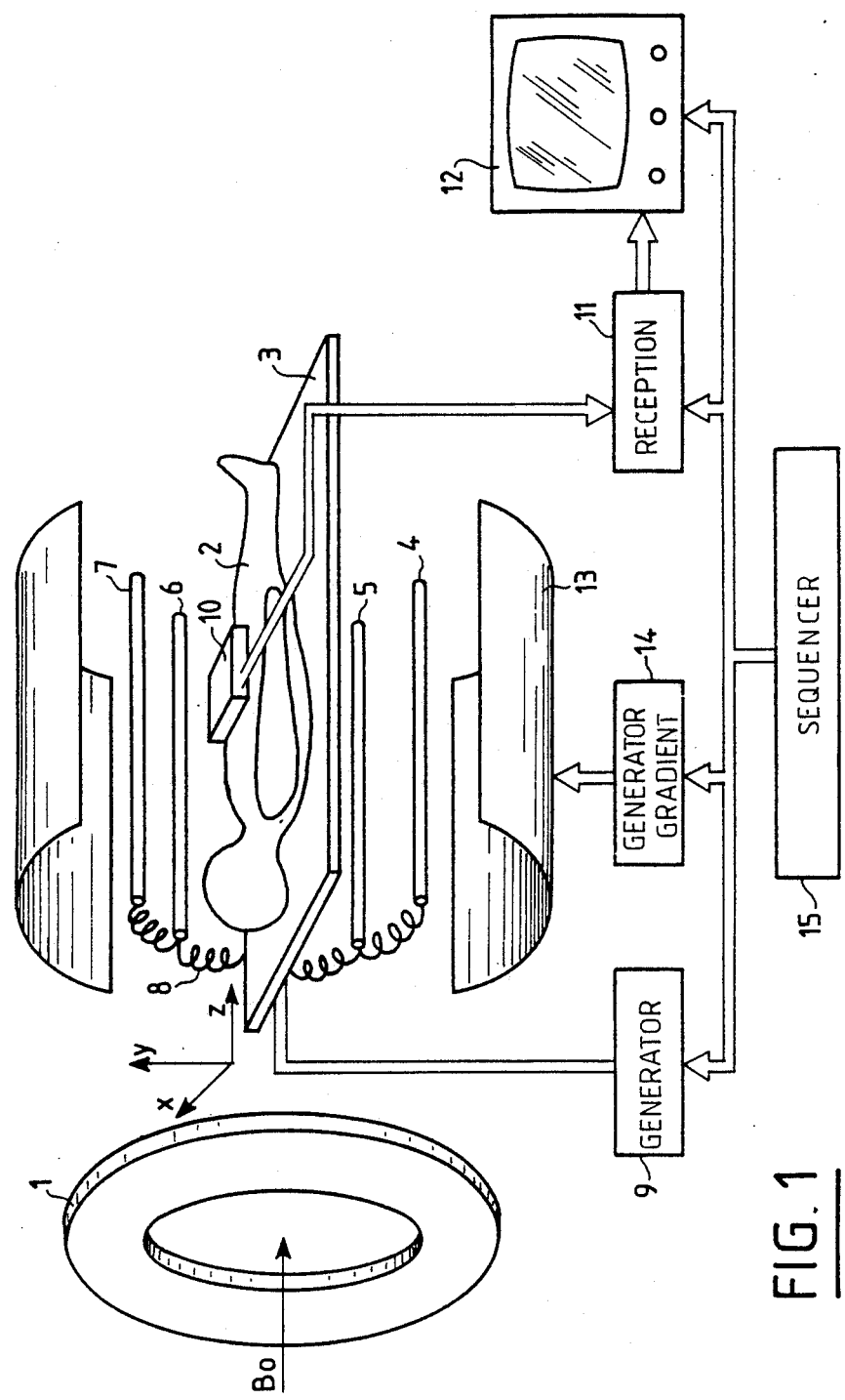
FIG. 1 shows an NMR machine which can be used to implement the method according to the invention.

FIG. 1 illustrates a machine which can be used for the application of the method according to the invention. This machine essentially comprises means represented by a coil 1, for producing a uniform magnetic field $B_0$ of high strength in a region in which a patient's body 2 is placed on a table 3. When subjected to this magnetization, the magnetic moments of the particles of the body 2 are oriented in the direction of the uniform field $B_0$. In this situation, the body 2 is also subjected to a radiofrequency electromagnetic excitation transmitted by an antenna consisting, for example, of radiating rods 4 to 7 and fed through a radiating circuit 8 by an excitation generator 9. After excitation, a receiving antenna 10 serves to collect the de-excitation signal which marks the return to equilibrium of the magnetic moments of the particles of the body 2. The receiving antenna may, besides, be identical with the emitting antenna. The received signal is processed in receiver 11 for the display of an image of a cross-section of the body 2 on a display device 12. In order to discriminate, in the received signal, the contributions of each volume element of the cross-section, a series of experiments is undertaken, during each of which magnetic codings of the space in which the body 2 is located are fixed at different values by additional magnetic fields applied to so-called gradient coils 13. The gradient coils are supplied by a gradiant pulse generator 14. The complete assembly operates under the control of a sequencer 15.

In practice, it is noted that the image can be reconstructed according to a method of reconstruction known as 2DFT, a general idea of the principle phases of this method being given in FIG. 2. A radiofrequency excitatin 160 is applied in the presence of a cross-section selection gradient pulse 170 (axis Z). A radiofrequency pulse 180 or so-called spin echo pulse is emitted subsequently in the presence of a cross-section selection gradient pulse 190 for selecting the same cross-section and eliminating defects in uniformity of the field $B_0$. During reception of the de-excitation signal 200, a so-called "read" gradient phase 210 is applied (axis X). Between the pulse 160 and the pulse 18 a phase encoding 220 of the NMR signal is applied (Y axis). From one experiment to the next (at the end of a time interval $T_r$), this phase encoding undergoes a variation. The levels 230, indicated with dashes, show the value that this phase encoding can take from one experiment to the next one.

The description made up to now takes into account the fact that the read axis to which a read gradient is applied is the axis X, while the phase encoding axis is the axis Y and the cross-section selection axis is the axis Z. In a known way, the functions of these axes can be interchanged or even combined to produce images with particular orientations. This does not interfere with the principle of the invention.

The image reconstruction computation is known and comprises two Fourier transforms: one said to be on $K_1$ which depends on the read gradient and one said to be on $K_2$ which depends on the phase encoding gradient. During an experiment of order i, the phase-coding gradient has the value $i \cdot K_2$. In the invention, the pitch of the phase encoding gradient $K_2$ is replaced by a pitch $k_2$ which is a sub-multiple of the pitch $K_2$. On the contrary, the number of successive experiments is a multiple, in reverse proportion, of the number used beforehand. It is a multiple only inasmuch as the goal is to achieve the same significant resolution of the images. FIG. 3 shows, with a ratio 2 to simplify the explanation, that the comprehensive exploration of the phase encoding gradient, in both cases, is done on the same scale. If $T_r$ is the interval between two successive sequences in both cases, the total duration of the sequences in the invention is quite simply a duration which is a multiple of the preceding one.

Figure 5:
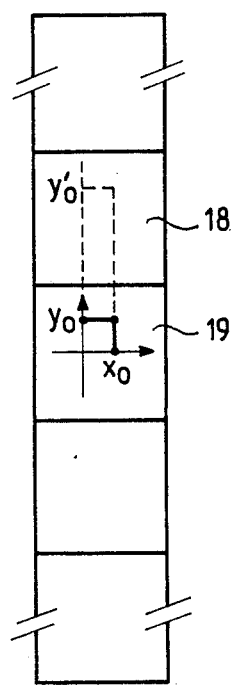
FIGS. 4 to 6 give schematic views of the significance of images obtained, respectively, in the prior art and with the method of the invention.
Figure 6:
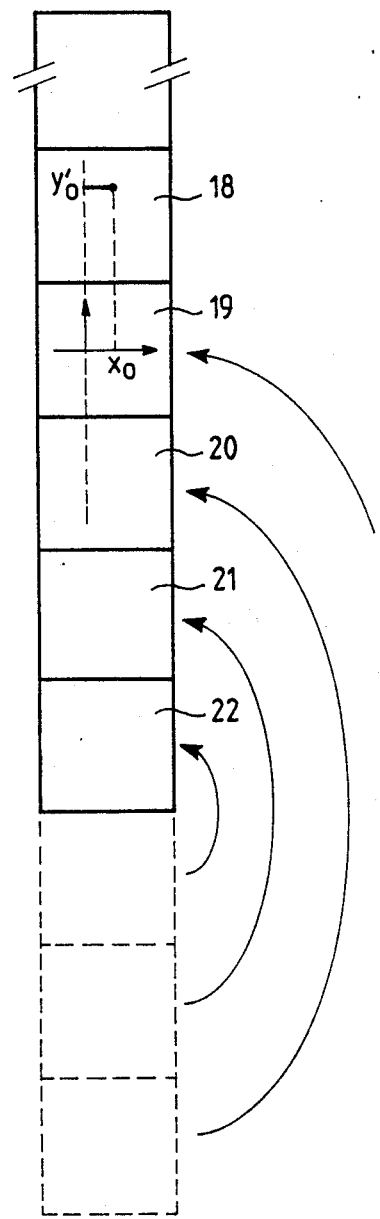
Figure 4:
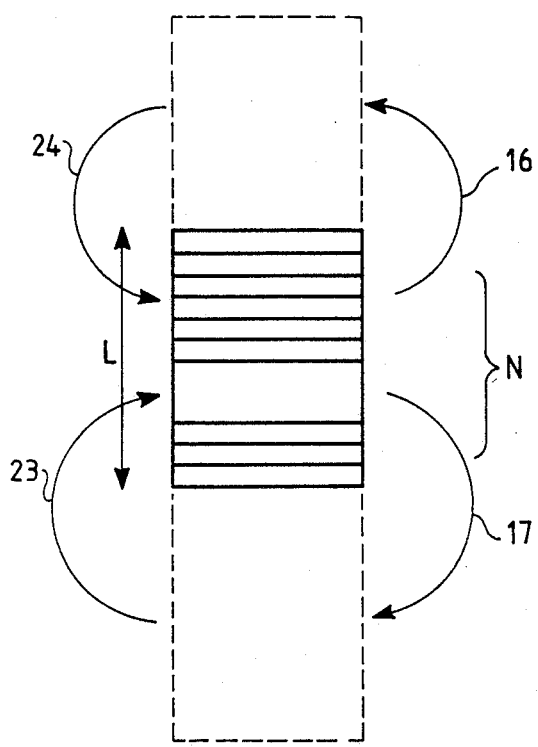

Referring to FIGS. 4 to 6, we shall now examine the significance of the content of the images obtained, respectively, in the prior art and in the invention. FIG. 4 shows the clearance of an image with a height L, the resolution of which comprises N lines. The acquisition of an image of this type is obtained conventionally with a phase encoding gradient $K_2$ such that:

$$K_2 \cdot L = 2\pi$$

The resolution N depends on the number N of sequences performed. Intuitively, it is seen that if only one sequence is performed, the image can be represented only by one line. In this image, the contributions of the particles located at different ordinates in the cross-section will not have been discriminated. The significance of the significant resolution of the image is related to the fact that it is always possible, mathematically, to produce an image on more than N lines when only N measurements have been acquired. This apparent resolution obtained is, in fact, not more precise than the preceding one since it can be shown that this greater number of lines does not provide any information to the image. It corresponds only to a simple interpolation.

If $S(i \cdot K_2)$ designates the NMR signal received during an order i experiment (in the prior art cited with $K_2$), it can be written that the value of the magnetic moment $M(y_0)$ at an ordinate $y_0$ can be obtained by the Fourier integral. In an approximation of this integral by a discrete computation, $M(y_0)$ as follows:

$$M(y_0) = \sum_{i=-N/2}^{i=N/2} e^{-j \cdot i \cdot K_2 \cdot y_0} \cdot S(i \cdot K_2)$$

In the final analysis, this magnetic moment represents the intensity of a corresponding light point on the image shown by a display screen. The ordinate of this corresponding light point, in a significant resolution, is such that $y_0 = a \cdot L/N$ where a is a constant depending on the height of the screen. The arrows 16 and 17 of FIG. 4 show that for $y_0$ external to the image L, one and the same image is reproduced. In fact, the terms $i \cdot K_2 \cdot y_0$ in the expression of $M(y_0)$ are found, by a translation of L, by a phase rotation of $2\pi$. It can be shown that the same applies to all the shifted images.

FIG. 5 shows, in the same conditions as FIG. 4, what happens in the invention when the encoding pitch has been taken as being equal to a sub-multiple. The value $M(y_0)$ is computed exactly in the same way except that the integration is done on a far greater number of points, in one example 2048 points.

When $y_0$ belongs to the interval of definition of L (L/2; −L/2), the computation of $M(y_0)$ leads to the same result as above, but with a Fourier transform with 2048 points instead of a Fourier transform with 256 points. At the most, this value is computed more precisely. However, for shifted images 18 of the central image 19, it can be shown that these images are now blank. This is, firstly, intuitive because, since the image field extends outside the placed in which the body 2 is located body 2 is located, the images corresponding to these parts where the body is absent should be blank. Besides, it is possible to find this result mathematically by observing that, for these images, the magnetic moments can be written in the form (in the example shown, and replacing $y'_0$ by $y_0 + 256$):

$$M(y'_0) = \sum_{i=-1024}^{i=+1024} e^{-j \cdot i \cdot k_2 \cdot 256} \cdot e^{-j \cdot i \cdot k_2 \cdot y_0} \cdot S(i \cdot k_2)$$

In this expression, the terms used to compute $M(y_0)$ weighted by a coefficient $\exp(-j \cdot i \cdot k_2 \cdot 256)$, can be seen at the right. In view of the fact that a sub-multiple $k_2$ of $K_2$ (in one example eight) has been chosen, this coefficient is equivalent to a phase rotation with a value $i \cdot \pi/4$. Since the mean value of this coefficient is null, it can be shown that the value of $M(y'_0)$ is also null. Hence the image 18 is a blank image.

FIG. 6 shows what becomes of the image 18 when, at the position of the coordinates $x_0$ $y_0$ in the cross-section, the magnetic moment of the particles resident therein are subjected to a pure sinusoidal alternating variation, the pulsation $w_0$ of which is such that:

$$w_0 \cdot T_r = \pi/4$$

This value corresponds exactly to the sub-multiple eight in the example chosen. As an initial estimate, this sinusoidal pulse may be the result of a heart pulse from which, for reasons of cause, the continuous component has been eliminated here. If the above-mentioned conditions occur, the signal S can be written:

$$S(i \cdot k_2) = 3j \cdot w_0 \cdot i \cdot T_r$$

By replacing this value of S in the above discrete integral of $M(y'_0)$, it is realized that the exponential coefficient, modulated by this sinusoidal value of S, is now a constant.

The result of this is that the image of the pure sinusoidal cyclical variation of the magnetic moments of the particles, located at $x_0$, $y_0$, in the cross-section in the body 2, now appears at the coordinates $x_0$, $y'_0$ of the image 18. In being generalized, this particularly worthwhile result leads to the representation, in the shifted images 18, 20, 21, 22, etc., of the harmonics of the temporal variations of the values of the magnetic moments. The harmonics are split up through a splitting up, into Fourier series, of the movement that causes the temporal variation. It can be shown that if the pulsing of the phenomenon explained is not exactly such that $w_0 \cdot T_r = \pi/4$, the images in harmonics are shifted vertically in the images 18 and 20 to 22. In practice, it is seen to it that this constraint is complied with in an approximate fashion by adjusting Tr.

In other words, if the cardiac pulse is not constant throughout the acquisition of the 2048 sequences, the image 18 will be fuzzy. On the contrary, the image 19 which, in the final analysis, represents all that is stationary in the body, or at least the continuous component of the variations of the magnetic moments of particles in the body, does not made to deteriorate by the variation of the heart cycle. Briefly, even if the image 18 is disturbed, the image 19 remains sharp. It is noted, besides, that this result is obtained without synchronization. It is then noted that if the order 3 harmonic appears in the image 22, the order 4 harmonic is aliased on this image 22. The order 5 harmonic is aliased on the image 21, the order 6 harmonic is aliased on the image 20 and the order 7 harmonic aliased on the image 19 which is the one that concerns us. This situation must be compared with that in the prior art where (FIG. 4) the arrows 23 and 24 show an aliasing in the images due to the fundamental rate in the main image. Now the motion to be taken into consideration, especially cardiac motion, can be split up into components with an influence that decreases with the order of the harmonic to which they correspond. In conclusion, the image 19 of what is stationary is less disturbed by the harmonic 7 of the motion than the main image could be, in the prior art, by the fundamental cycle of this motion. And to obtain the image 19, all that is needed, in the example, is to perform 256 Fourier transforms (corresponding to 256 $y_0$ useful ordinates) with 2048 computing points each. In the prior art, 256 Fourier transforms with 256 computing points each were performed.

Figure 7A:
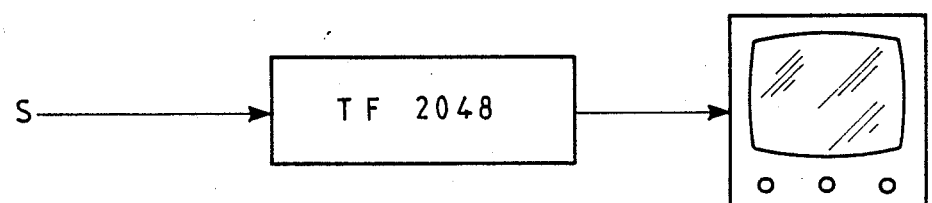
FIGS. 7a and 7b depict alternatives of the method according to the invention.
Figure 7B:
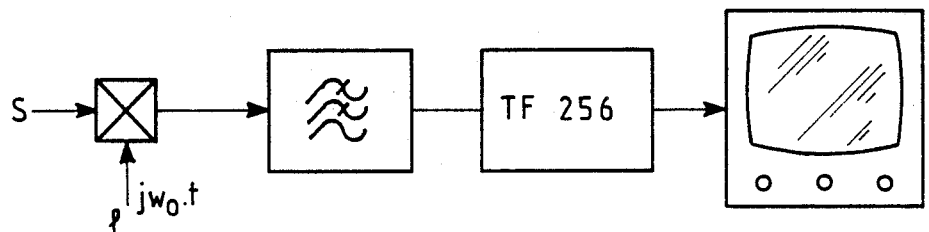

Instead of showing the image of what is stationary, it may be worthwhile to show the image of a given harmonic. If it is assumed that the rate of the movement studied is constant, this result can be achieved in two ways. In a first approach, a computation is made, for the considered harmonic image, as indicated up to now, of Fourier transforms with 2048 points. As an alternative, a demodulation is made of the NMR signal measured by a theoretical signal oscillating at the frequency of the phenomenon that is sought to be studied. The demodulated signal is filterd at low frequency and the image of this harmonic is re-computed with a Fourier transform with 256 computing points only. FIGS. 7a and 7b give a schematic view of these two possible alternatives.

What is claimed is:

1. A method for the removal of artifacts in NMR imaging experiment wherein
    a 2DFT type imaging method is applied to reconstruct a normal image of a body to be examined,
    with a phase encoding normal pitch of a phase encoding gradient,
    said normal pitch being predetermined by a height of given value of a zone of interest of a NMR machine being used where the body to be imaged is positioned,
    a dimension of said normal image corresponding to said height of given value,
    and said experiment comprising a number N of sequences which is predetermined by an expected significant resolution of the normal image of said body,
    said 2DFT imaging method being performed to reconstruct said normal image from said NMR experiment,
    wherein the phase encoding pitch is modified by taking a sub-multiple of said normal pitch,
    and wherein the number N of sequences is multiplied accordingly,
    to permit the reconstruction of another image for a same significant resolution of said normal image of said body but with a different dimension, along a direction corresponding to this phase encoding pitch, wherein said different dimension is a multiple of said dimension of said normal image.

2. A method according to claim 1 wherein a significant part of the other image is reconstructed by a Fourier transform having a number of points which a multiple of said number N to obtain at least one part of said other image with at least N lines.

3. A method according to claim 2 wherein imaging method comprises sequences with an elementary duration $T_r$ and wherein the total duration of a multiple number of consecutive sequences is equal to a cycle time of a cyclical phenomenon to be studied in the body under experiment.

4. A method according to claim 3 wherein several images with N lines are extracted from the other reconstructed image, each image corresponding to a harmonic component of a harmonic splitting of said cyclical phenomenon.

5. A method according to claim 1 wherein the experiment comprises sequences including a radio frequency excitation followed by a measurement of the NMR signal re-emitted in response to the excitation and wherein the measured signal is de-modulated by a harmonic signal of a cyclical phenomenon in the body under experiment and then filtered before the image is reconstructed by at least N Fourier transforms with said multiple of N computing points to obtain at least one image with at least N lines.

* * * * *